United States Patent [19]

Srinivasan et al.

[11] Patent Number: 5,264,741
[45] Date of Patent: Nov. 23, 1993

[54] LOW CURRENT, FAST, CMOS STATIC PULLUP CIRCUIT FOR STATIC RANDOM-ACCESS MEMORIES

[75] Inventors: Adi Srinivasan, Fremont; Ta-Pen Guo, Cupertino, both of Calif.

[73] Assignee: Aptix Corporation, San Jose, Calif.

[21] Appl. No.: 901,603

[22] Filed: Jun. 19, 1992

[51] Int. Cl.$^5$ ............................................ H03K 19/017
[52] U.S. Cl. ..................................... 307/443; 307/451; 365/189.09; 365/189.11
[58] Field of Search ....................... 365/189.09, 189.11; 307/443, 449, 451, 475, 530

[56] References Cited

U.S. PATENT DOCUMENTS

| | | | |
|---|---|---|---|
| 4,750,155 | 6/1988 | Hsieh | 365/154 X |
| 4,771,284 | 9/1988 | Masleid et al. | 307/465 X |
| 4,918,341 | 4/1990 | Galbraith et al. | 307/530 |
| 5,020,028 | 5/1991 | Wanlass | 365/154 |
| 5,041,746 | 8/1991 | Webster et al. | 365/189.11 X |
| 5,056,062 | 10/1991 | Kuwabara et al. | 365/189.11 |
| 5,109,167 | 4/1992 | Montegani | 307/475 X |
| 5,148,390 | 9/1992 | Hsieh | 365/154 X |
| 5,191,555 | 3/1993 | Tabacco et al. | 365/230.02 X |

*Primary Examiner*—David R. Hudspeth
*Attorney, Agent, or Firm*—Kenneth D'Alessandro

[57] ABSTRACT

A pullup circuit for use with plurality of N-Channel pulldown transistors connected to a bit line includes a P-channel MOS pullup transistor connected between the bit line and a voltage rail. An inverter is connected between the bit line and the drain of an N-Channel MOS transistor having its gate connected to the voltage rail and its source connected to the gate of the P-Channel MOS pullup transistor. A first P-Channel MOS transistor is connected between the voltage rail and the gate of the P-Channel MOS pullup transistor. A second P-Channel MOS transistor having its gate connected to ground is connected between the bit line and the gate of the first P-Channel MOS transistor. Four P-Channel MOS divider transistors are connected between the drain of the first P-Channel MOS transistor and ground. The gates of the P-Channel MOS divider transistors are connected together to ground. The P-Channel MOS pullup transistor and the N-Channel MOS pulldown transistors are large. The first and second P-Channel MOS transistors, the first N-Channel MOS transistor, and the P-Channel MOS divider transistors are close to minimum size. The P-Channel and N-Channel devices comprising the inverter devices are larger than minimum size.

1 Claim, 3 Drawing Sheets

LOW CURRENT, FAST, CMOS STATIC PULLUP CIRCUIT FOR STATIC RANDOM-ACCESS MEMORIES

BACKGROUND OF THE INVENTION

1. Field of the Invention

The present invention relates to semiconductor memory devices. More particularly, the present invention relates to a new static CMOS pullup cell, which is fast and consumes less current than a conventional pullup.

2. The Prior Art

Pulldown circuits comprising a plurality of N-Channel MOS transistors and a P-Channel dual are well known in the art. A pullup circuit may be used in place of the P-Channel dual. Such pullup circuits are normally designed for speed, although a tradeoff between speed and current tradeoff may sometimes be made for certain applications where reads are infrequent, and read-time isn't critical. Unlike the P-Channel dual it replaces, which is off (i.e., no current path from $V_{DD}$ to output) when the pulldown device(s) is on, the pullup circuit is on for some, if not all, of the time during which the pulldown device(s) is on. This operating mode results in static current or a large switching current consumption.

Static current flow and large switching currents may be tolerated in certain applications. However, there are applications where reduction or elimination of static current flow and reduction of large switching currents would be desirable.

It is an object of the present invention to provide a new static CMOS pullup cell, which is faster than a comparably-sized prior art pullup with feedback and which consumes less current than such a pullup.

It is a further object of the present invention to provide a pullup which, unlike prior art constant-current pullup circuits, consumes negligible static current and is less sensitive to process variation than either constant-current or feedback pullups.

Yet another object of the present invention is to provide a pullup which uses the same type (enhancement) MOS transistors as prior art pullups and can be fabricated using the existing CMOS processes without need to alter the processes.

BRIEF DESCRIPTION OF THE INVENTION

A pullup circuit according to a presently preferred embodiment of the invention for use with plurality of N-Channel pulldown transistors connected between a bit line and a ground (with possibly intervening select devices) includes a P-channel MOS pullup transistor connected between the bit line and a voltage rail. An inverter is connected between the bit line and the drain of an N-Channel MOS transistor having its gate connected to the voltage rail and its source connected to the gate of the P-Channel MOS pullup transistor. A first P-Channel MOS transistor is connected between the voltage rail and the gate of the P-Channel MOS pullup transistor. A second P-Channel MOS transistor having its gate connected to ground is connected between the bit line and the gate of the first P-Channel MOS transistor. Four P-Channel MOS divider transistors are connected between the drain of the first P-Channel MOS transistor and ground. The gates of the P-Channel MOS divider transistors are connected together to ground. The P-Channel MOS pullup transistor and the N-Channel MOS pulldown transistors are large. The first and second P-Channel MOS transistors, the first N-Channel MOS transistor, and the P-Channel MOS divider transistors are close to minimum size. The P-Channel and N-Channel devices comprising the inverter devices are larger than minimum size.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
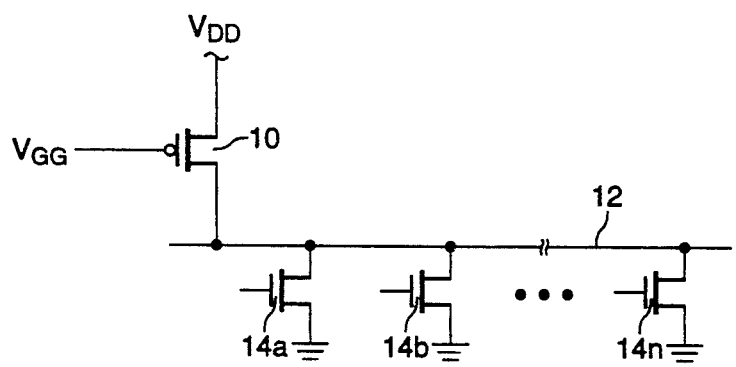
FIG. 1 is a schematic diagram of a first common type of known prior art pullup.
Figure 2:
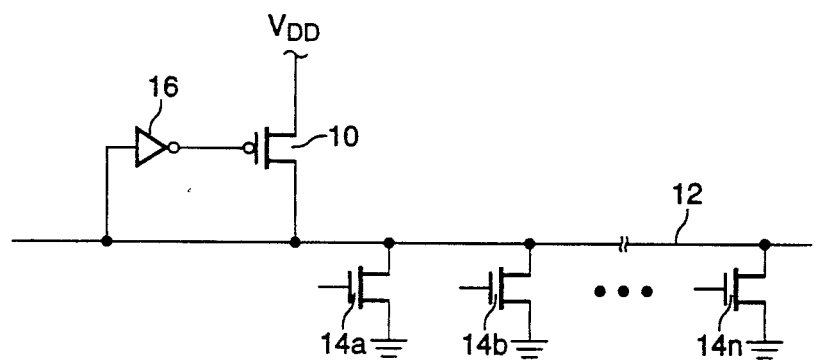
FIG. 2 is a schematic diagram of a second common type of known prior art pullup.

Common types of existing pullup circuits are shown in schematic diagram form in FIGS. 1 and 2. In the embodiments of both FIGS. 1 and 2, a P-Channel MOS transistor 10 has its source connected to $V_{DD}$ and its drain connected to a bit line 12.

In the embodiment of FIG. 1, the gate of P-Channel MOS pullup transistor 10 is connected to a fixed voltage $V_{GG}$. $V_{GG}$ is usually in the range of about less than $V_{DD}-V_{TP}$ and greater than $V_{TN}$. In the embodiment of FIG. 2, the gate of P-Channel MOS pullup transistor 10 is driven by the output of an inverter 16, having its input connected to bit line 12.

A plurality of N-Channel pulldown transistors 14a–14n are connected between the bit line 12 and ground in both embodiments. These are the devices against which the pullup circuit must pull the bit line up. Those of ordinary skill in the art will recognize that, in an actual embodiment, a pass or select transistor would be connected in series between each N-Channel pulldown device and ground, but such devices have been omitted from the drawing figures so as not to overcomplicate them.

A pullup needs to have good loading characteristics. When in its pulled down (static) condition, it should satisfy:

$$((R_{N\text{-}Channel\text{-}on} \times V_{DD})/(R_{P\text{-}Channel\text{-}on} + R_{N\text{-}Channel\text{-}on})) \leq V_{OL}. \quad [1]$$

where $R_{P\text{-}Channel\text{-}on}$ and $R_{N\text{-}Channel\text{-}on}$ are the on resistances, respectively, of the pullup device and of the most resistive of the N-Channel pulldown devices, respectively.

The dynamic loading (rise time) for the pullup device is more important; $I_{DS}$ should not decrease sharply as $V_{DS}$ decrease, since rise time $\alpha \int I^{-1}_{DS} dV$. Finally, the pullup load should approximate an ideal depletion load. For the pullup of FIG. 1, the ratio of $R_{P\text{-}Channel\text{-}on}$ to $R_{N\text{-}Channel\text{-}on}$ should be constant over process variations.

Figure 3:
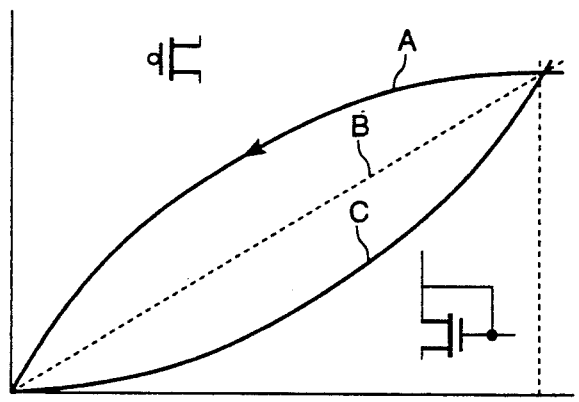
FIG. 3 is a comparative graph showing the I-V curves of the pullup of FIG. 1 compared with a resistive pullup and an enhancement N-Channel transistor pullup.

FIG. 3 is a comparative graph showing the I-V curves of the pullup of FIG. 1 compared with a resistive pullup and an enhancement N-Channel transistor pullup. Curve A is for the circuit of FIG. 1. The dashed line (curve B) represents a resistive pullup load. Curve C is for an enhancement N-Channel transistor pullup.

Figure 4:
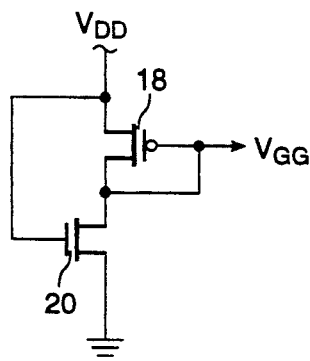
FIG. 4 is a schematic diagram showing a typical circuit for generating $V_{GG}$ for the pullup circuit of FIG. 1.

In general the three goals mentioned above are accomplished by controlling the pullup gate voltage $V_{GG}$. For the simple one-transistor P-Channel pullup circuit depicted in FIG. 1, a typical pulldown is used as a current-mirror reference to generate $V_{GG}$ as shown in FIG. 4. P-Channel MOS transistor 18 has its source connected to $V_{DD}$ and its drain connected to the drain of N-Channel MOS transistor 20. The source of N-Channel MOS transistor 18 is connected to ground. P-Channel MOS transistor 18 is diode connected, its gate connected to its drain forming the output voltage node $V_{GG}$. The gate of N-Channel MOS transistor 20 is connected to $V_{DD}$.

If N-Channel MOS transistor 20 is strong, $V_{GG}$ is pulled lower, causing a typical pullup of FIG. 1 to turn on harder. Using $V_{GG}$ (instead of ground) also results in lower current sensitivity to mobility, and less average power dissipation. As shown in FIG. 3, the rise time of the pullup circuit of FIG. 1 using the $V_{GG}$ generator circuit of FIG. 4 (Curve A) is faster than a resistive pullup (Curve B) or a pullup comprising an enhancement mode N-Channel MOS transistor (Curve C). Those of ordinary skill in the art will note that in the static case (dc), the three pullup types shown in FIG. 3 are equivalent, though the enhancement N-Channel MOS transistor (Curve C) does not pull up as high as the other two.

The pullup circuit of FIG. 1 has a fast rise time because P-Channel MOS pullup transistor 10 is always "on" at a constant (large) value of current. Note that the rising and falling transients follow the faster-rise I-V curve in FIG. 3. The pulldown must have lower resistance (eq. [1]), and hence must have large W/L to sink this current. Since the number of pulldowns may be large, pullup speed costs layout area.

Figure 5:
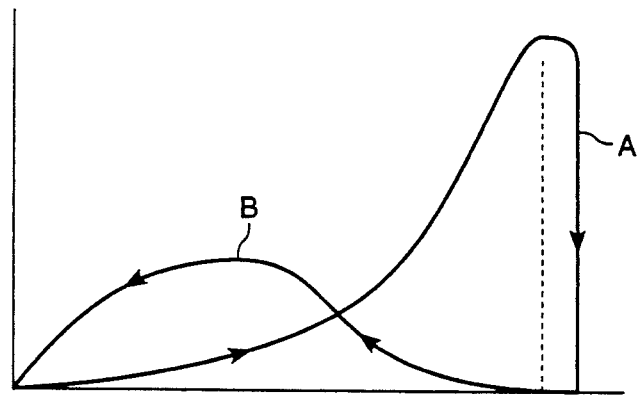
FIG. 5 is a graph showing an I-V curve for the pullup device of FIG. 2.

FIG. 5 shows the I-V curve for the pullup device of FIG. 2. The static behavior of the pullup circuit depicted in FIG. 2, (when the pulldown devices are off) is like the pullup of FIG. 1, since the gate of P-Channel MOS pullup transistor 10 is driven low ($V_{SS}$). However, since the gate of P-Channel MOS pullup transistor is at $V_{GG} > V_{SS}$, the pullup current while rising is greater (assuming equal pullup W/L) than that of the pullup circuit of FIG. 1.

When one (or more) of the pulldown devices in the circuit of FIG. 2 is on, the static behavior of the pullup circuit of FIG. 2 is very different than the pullup of FIG. 1, since the input of inverter 16 is pulled low and inverter 16 thus drives the gate of P-Channel MOS pullup transistor 10 high. This turns off P-Channel MOS pullup transistor 10. There is thus no pullup current, i.e., no static power dissipation.

When the N-channel pulldown devices are turned off, the bit line, i.e., the gate of inverter 16, is charged and pulled high. As the pulldown devices turn on, the voltage across P-Channel MOS pullup transistor 10 rises to at least ($V_{DD} - V_{OL}$) since their on resistance satisfies (eq. [1]). This pulls the gate of inverter 16 low, thus driving the gate of P-Channel MOS pullup transistor 10 high and turning it off. While inverter 16 transitions, however, a large supply current $\approx VDD/(R_{P\text{-}Channel\text{-}on} + R_{N\text{-}Channel\text{-}on})$ is drawn, decreasing as the output of inverter 16 rises and $R_{P\text{-}Channel\text{-}on}$ rises, until P-Channel MOS pullup transistor 10 is finally in cut-off and its current $I_{PU}$ is approximately zero. This transition is shown in Curve A (output falling) of FIG. 5.

The transient behavior of the pullup device of FIG. 2 may be described as follows. I rises monotonically as V increases, rising sharply and peaking at $V \approx (V_{DD} - V_{OL})$ while inverter 16 transitions, then drops to a negligible value.

When the pulldowns are on, in the steady state, P-Channel MOS pullup transistor 10 is turned off. After the pulldowns turn off, the voltage on the bit line (inverter 16 input) drifts higher due to charge leakage onto the line from P-Channel MOS pullup transistor 10, which is often a small "leaker" P-Channel MOS transistor, input low, is used to continually leak charge onto the bit-line; this can make the performance process sensitive). As the bit-line voltage rises above $V_T$ of the N-Channel MOS transistor component of inverter 16, the gate of P-Channel MOS pullup transistor 10 is pulled down, increasing $I_{PU}$ and causing a boot-strap effect. Initially the process is slow, as shown in curve B (output rising) of FIG. 5. After the input of inverter 16, the bit line and associated parasitic capacitances are charged (pulled-up) through P-Channel MOS pullup transistor 10, $I_{PU}$ drops to $\approx 0$.

While the pullups of FIGS. 1 and 2 are useful devices, they suffer from several drawbacks. The pullup of FIG. 1 consumes large static current $\approx VDD/(R_{P\text{-}Channel\text{-}on} + R_{N\text{-}Channel\text{-}on})$. In the pullup using the $V_{GG}$ generator of FIG. 4, $V_{GG}$ can be sensitive to process variations in P-Channel MOS transistor 18 and N-Channel MOS transistor 20 if many pullups are driven by a few $V_{GG}$ generators. Also P-Channel MOS transistor 18 and N-Channel MOS MOS transistor 20 are approximately the same size as P-Channel MOS pullup transistor 10 and the N-Channel pulldown devices 14a–14n in FIG. 1.

In the pullup of FIG. 2 the N-channel pulldown devices must "fight" to pull-down P-Channel MOS pullup transistor 10, and if (eq [1]) is only marginally satisfied, process variations can make a single N-Channel pulldown device unable to pull down P-Channel MOS pullup transistor 10 below $V_{OL}$. Also the P-device-slow, N-device-fast process corner can make the current peak of the "output falling" curve near $V \approx V_{DD} - V_{OL}$ of FIG. 5 larger. Finally, the low initial current during pullup ("region of slow rise" in FIG. 5) leads to a large pullup rise time proportional to $\int I^{-1}_{DS} dV$.

Figure 6:
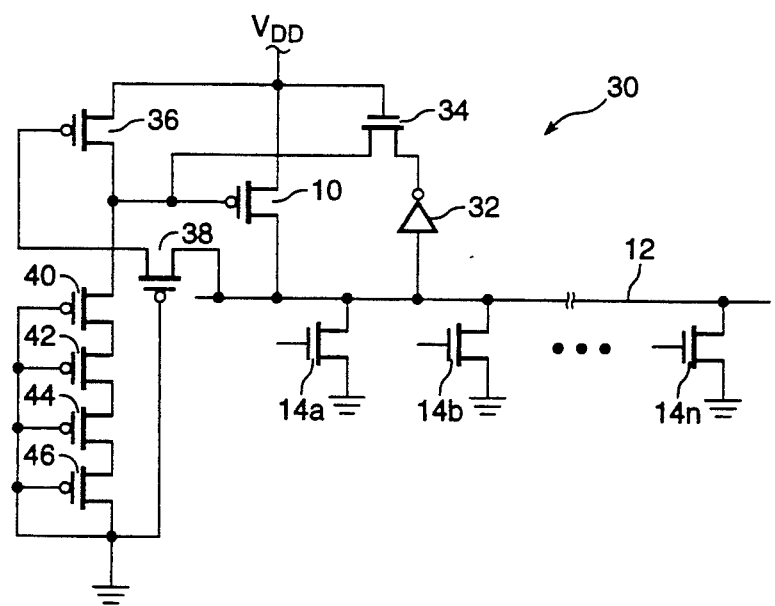
FIG. 6 is a schematic diagram of a presently preferred embodiment of a pullup circuit according to the present invention.

Referring now to FIG. 6 a schematic diagram of a pullup circuit 30 according to a presently preferred embodiment of the invention is shown. A plurality of N-channel pulldown transistors 14a–14n are connected between a bit line 12 and ground. As in the prior art pullup circuits depicted in FIGS. 1 and 2, select devices are omitted.

A P-channel MOS pullup transistor 10 is connected between the bit line 12 and voltage rail $V_{DD}$. An inverter 32 is connected between the bit line 12 and the drain of an N-Channel MOS transistor 34, which has its gate connected to $V_{DD}$ and its source connected to the gate of P-Channel MOS pullup transistor 10.

A P-Channel MOS transistor 36 is connected between $V_{DD}$ and the gate of P-Channel MOS transistor 10. A P-Channel MOS transistor 38 is connected between the bit line 12 and the gate of P-Channel MOS transistor 36 and has its gate connected to ground. Four P-Channel MOS transistors 40, 42, 44, and 46 are connected between the drain of P-Channel MOS transistor 36 and ground. The gates of P-Channel MOS transistors 40, 42, 44, and 46 are connected together to ground.

P-Channel MOS pullup transistor 10 and N-Channel MOS pulldown transistors 14a–14n satisfy eq. [1] and are large. P-Channel MOS transistors 36 and 38, N-Channel MOS transistor 34, and P-Channel MOS transistors 40, 42, 44, and 46 are typically close to minimum size. The P-Channel and N-Channel devices comprising inverter 32 are larger. The overall layout area of the circuit of FIG. 6 is comparable to the pullup circuit of FIG. 2.

As an illustrative aid to sizing the transistor devices of the pullup circuit of the present invention, if the size of all of the N-Channel pulldown transistors 14a–14n is normalized to be equal to $\alpha$, then the size of P-Channel MOS pullup transistor 10 should be about $3\alpha n/2$, where n (n<5) is the number of N-Channel pulldown transistors. In the inverter 32, the P-Channel transistor should be about $3\alpha$ and the N-Channel transistor should be about $2\alpha$. N-Channel MOS transistor 34 should be about $\alpha$. P-Channel MOS transistor 36 should be about $3\alpha$. P-Channel MOS transistor 38 should be about $3\alpha/2$. P-Channel MOS transistors 40, 42, 44, and 46 should also be about $3\alpha/2$. From this example, which assumes a standard CMOS process, those of ordinary skill in the art should be readily able to size the devices for various applications.

There are two feedback paths in the pullup circuit according to the present invention. The first feedback path comprises the path from the input of inverter 32 at bit line 12 to the gate of P-Channel MOS pullup transistor 10 through N-Channel MOS transistor 34. The second feedback path comprises the path from the bit line 12 through P-Channel MOS transistor 38 to the gate of P-Channel MOS transistor 36. The first feedback path is the same feedback path as the pullup circuit of FIG. 2. The second feedback path, and the feedback voltage it generates to the gate of P-Channel MOS pullup transistor 10 are new. This improves the dynamic performance of the pullup circuit of the present invention over pullup circuits such as the one depicted in FIG. 2. The second feedback path also reduces process sensitivity of the pullup circuit by self-referencing with a resistive divider to set the gate voltage.

Since the voltage at the gate of P-Channel MOS pullup transistor 10 depends on the inputs (i.e., the voltages at the gates of N-Channel MOS pulldown transistors 14a–14n), it is unlike the constant $V_{GG}$ of the prior art pullups. Also the P-Channel voltage divider comprising transistors 36, 40, 42, 44, and 46 is not a current mirror circuit, like the $V_{GG}$ generator of FIG. 3.

Figure 7:
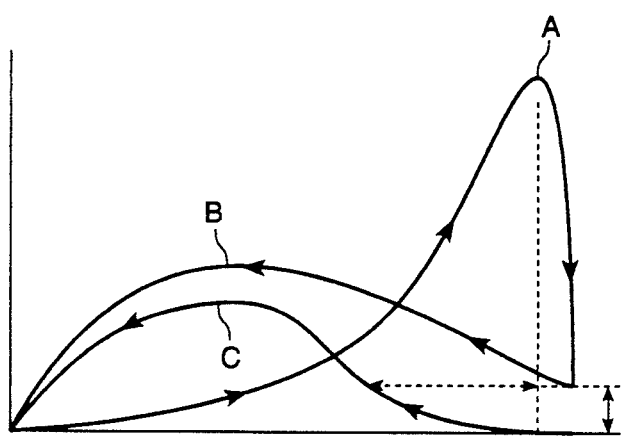
FIG. 7 is a graph showing an I-V curve for the pullup circuit of FIG. 6.

FIG. 7 is a graph showing the dynamic I-V behavior for the pullup circuit of FIG. 6. Curve A shows the high to low transition of the pullup. Curve B shows the low to high transition of the pullup. Curve C shows the low to high transition of the pullup of FIG. 2 for comparison.

The steady-state operation of the pullup circuit of the present invention depicted in FIG. 6 when on and off is very similar to the pullup of FIG. 2. When the N-Channel pulldown transistors are off, the steady state is like that of the pullup circuit of FIG. 2, since the gate of P-Channel MOS pullup transistor 10 is driven low ($=V_{SS}$). A small leakage current flows through P-Channel MOS transistor 36, N-Channel MOS transistor 34, the N-Channel MOS transistor component of inverter 32. The current through P-Channel MOS pullup transistor 10 after the bit line is charged is zero. This condition is shown at the origin of the graph of FIG. 7.

When the N-Channel pulldown transistors 14a–14n are in their on state, the static behavior of the pulldown circuit of the present invention is also similar to the behavior of the circuit of FIG. 2, but with one important difference. In the pullup circuit according to the present invention, P-Channel MOS pullup transistor 10 is kept barely in inversion, its gate voltage equal to about $V_{DD}$ minus a P-Channel threshold drop, rather than in cutoff. Thus the static current through P-Channel MOS pullup transistor 10 is much less than that of the circuit of FIG. 1, and the bit line voltage is slightly less than $V_{DD}$. N-Channel MOS transistor 34 prevents the P-Channel MOS transistor component in inverter 24 from driving the gate of P-Channel MOS transistor 10 to VDD (cutoff) and ensures that this voltage is no higher than ($V_G < = V_{DD} - V_{TN}$). This condition is shown in the right-hand portion of FIG. 7.

The dynamic behavior of the pullup circuit of the present invention may also be understood with reference to FIGS. 6 and 7. When the pulldown transistors 14a–14n turn on, the behavior of the circuit of FIG. 6 is similar to the behavior of the circuit of FIG. 2 except that the second feedback path is now present to aid in driving the gate of P-Channel MOS transistor 10 high. In the second feedback path, P-Channel MOS transistor 38 pulls down the gate of P-Channel MOS transistor 36, increasing the gate voltage of P-Channel MOS pullup transistor 10. The device sizes of P-Channel MOS transistor 36, P-Channel divider transistors 40, 42, 44, and 46, N-Channel MOS transistor 34 and the P-Channel transistor component of inverter 32 are adjusted to set the gate voltage of P-Channel MOS pullup transistor 10.

If the devices are sized as disclosed herein, the steady-state gate voltage ($V_G$) of P-Channel MOS transistor pullup transistor $10 \approx V_{DD} - VT_P$ with steady-state current through P-Channel MOS pullup transistor $10 \propto (V_G - VT_P)^2$. Setting $V_G << V_{DD} - VT_P$ results in a larger current through P-Channel MOS transistors 40, 42, 44, and 46, and setting $V_G$ closer to $V_{DD}$ means using a larger P-Channel MOS transistor 36. Either course of action tends to defeat the purpose of the invention. The use of two feedback paths reduces the current through P-Channel MOS pullup transistor 10 faster, resulting in a lower maximum current, as shown in the "falling" curve of FIG. 7, hence slightly less transient power dissipation.

The pullup circuit of the present invention accomplishes the pulldown turn-off transition much faster than the circuit of FIG. 2 since P-Channel MOS pullup transistor 10 is already in saturation. As the N-Channel pulldown transistors turn off, the bit-line voltage rises even without feedback, charged by the current through P-Channel MOS pullup transistor 10. This causes P-Channel MOS transistor 36 to turn off faster (through P-Channel MOS transistor 38) and the output of inverter 24 to drop faster, increasing the feedback. The P-Channel MOS transistors 40, 42, 44, and 46 pull down inverter 24 as P-Channel MOS transistor 36 turns off, and ensure the $V_G$ of P-Channel MOS pullup transistor 10 is greater than 4* $V_D$ (diode turn-on voltage).

The advantage of the circuit of FIG. 6 over the circuit of FIG. 2 is shown in FIG. 7 as $\Delta V$, the change in voltage across FIG. 2 pullup as it takes time to increase the current through P-Channel MOS pullup transistor 10 to its maximum value. If $\Delta t = C_{load} \int I_{PU}^{-1} dV$ (in the limits $V_{DD}$ to $V_{DD} - \Delta V$), then the value of $\Delta t$ for the circuit of FIG. 2 is much larger than the value of $\Delta t$ for the circuit of the present invention, since $I_{PU}$ (FIG. 2) is less than the current through P-Channel MOS transistor 10 in the $\Delta V$ region. Thus the bit line 12 is pulled up faster than the bit line in the circuit of FIG. 2, and is in fact pulled up at a rate comparable to that of the circuit of FIG. 1. In summary this is because the slow transition from cutoff to saturation in the circuit of FIG. 2 is bypassed in the pullup circuit of the present invention, which is kept in saturation.

Since $V_G$ of P-Channel MOS pullup transistor 10 alone determines its source-drain current in saturation, adjusting the device sizes of P-Channel MOS transistor 36, P-Channel MOS transistors 40, 42, 44, and 46, N-Channel MOS transistor 34 and the inverter 32 will set the saturation source-drain current of P-Channel MOS pullup transistor 10. Since the P-Channel divider uses only P-Channel transistors, and, unlike $V_{GG}$ generators which may be shared, each pullup circuit has its own divider, it is less sensitive to process variations. Thus if a process affects one region of a wafer, presumably all of the local devices will be affected. With the present invention, all voltages will track somewhat, as opposed to the case of a central $V_{GG}$ generator, whose output voltage will be incorrect for the affected portion of the wafer.

The pullup circuit of the present invention has several benefits over the prior art circuits. It has faster rise time than the circuit of FIG. 3. Its rise time is comparable to that of the circuit of FIG. 1, but it uses a smaller P-Channel MOS pullup transistor than the circuit of FIG. 1.

The circuit of the present invention has a low static current and uses less power than the circuit of FIG. 1, which needs to employ larger currents for speed. It is important that $V_{GG} = VG$ of P-Channel MOS pullup transistor $10 \approx V_{DD} - V_{TP}$ since the maximum current through P-Channel MOS transistor pullup $10 \propto (VGG - VTP)^2$.

The circuit of the present invention is less sensitive to process variations than the circuits of FIGS. 1 and 3. In addition, P-Channel MOS transistors 36, 40, 42, 44, and 46, and N-Channel MOS transistor 34 are small compared to P-Channel MOS pullup transistor 10 and the N-Channel pulldown transistors 14a-14n, resulting in a smaller layout than the circuit of FIG. 1, having a size comparable to that of the circuit of FIG. 2.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A pullup circuit for use with at least one N-Channel pulldown transistor connected to a bit line comprising:

a P-Channel MOS pullup transistor having a source connected to a voltage rail a drain connected to said bit line, and a gate;

a N-Channel MOS transistor having a gate connected to said voltage rail, a source connected to the gate of the P-Channel MOS pullup transistor, and a drain;

an inverter connected between said bit line and said drain of said N-Channel MOS transistor;

a first P-Channel MOS transistor connected between said voltage rail and said gate of said P-Channel MOS pullup transistor;

a second P-Channel MOS transistor having a gate connected to ground, a drain connected to said bit line and a source connected to said gate of said first P-Channel MOS transistor;

four P-Channel MOS divider transistors connected in series between said drain of said first P-Channel MOS transistor and ground, said four P-Channel MOS divider transistors having gates connected together to ground;

wherein said P-Channel MOS pullup transistor and said at least one N-Channel MOS pulldown transistor are large, said first and second P-Channel MOS transistors, said first N-Channel MOS transistor, and said P-Channel MOS divider transistors are about minimum size, and said inverter comprises series-connected P-Channel and N-Channel devices larger than minimum size.

* * * * *